US007378925B2

(12) United States Patent
Ito et al.

(10) Patent No.: US 7,378,925 B2
(45) Date of Patent: May 27, 2008

(54) DIELECTRIC RESONATOR, DIELECTRIC RESONATOR FREQUENCY ADJUSTING METHOD, AND DIELECTRIC RESONATOR INTEGRATED CIRCUIT

(75) Inventors: Masaharu Ito, Tokyo (JP); Kenichi Maruhashi, Tokyo (JP); Shuya Kishimoto, Tokyo (JP); Keiichi Ohata, Tokyo (JP)

(73) Assignee: NEC Corporation, Tokyo (JP)

( * ) Notice: Subject to any disclaimer, the term of this patent is extended or adjusted under 35 U.S.C. 154(b) by 182 days.

(21) Appl. No.: 10/546,587

(22) PCT Filed: Feb. 23, 2004

(86) PCT No.: PCT/JP2004/002052

§ 371 (c)(1),
(2), (4) Date: Aug. 23, 2005

(87) PCT Pub. No.: WO2004/075337
PCT Pub. Date: Sep. 2, 2004

(65) Prior Publication Data
US 2006/0152306 A1 Jul. 13, 2006

(30) Foreign Application Priority Data
Feb. 24, 2003 (JP) .............................. 2003-045304

(51) Int. Cl.
*H01P 7/10* (2006.01)
(52) U.S. Cl. ...................... 333/219; 333/219.1; 331/96; 331/107 DP
(58) Field of Classification Search ................ 333/202, 333/208, 219, 219.1, 239; 331/107 DP, 331/108 SL, 177 V, 96, 107 SL
See application file for complete search history.

(56) References Cited

U.S. PATENT DOCUMENTS 4,565,979 A * 1/1986 Fiedziuszko ............ 331/117 D
4,716,387 A * 12/1987 Igarashi ........................ 333/26
5,208,561 A * 5/1993 Delestre et al. ........... 333/22 R
6,204,739 B1 * 3/2001 Sakamoto et al. ....... 333/219.1
6,356,172 B1 * 3/2002 Koivisto et al. ............. 333/231

FOREIGN PATENT DOCUMENTS

JP 2000114828 A * 4/2000

OTHER PUBLICATIONS

Ito et al., "A 60-GHz-Band Planar Dielectric Waeguide Filter for Flip-Chip Modules", IEEE Trans. on Microwave Theory & Techniques, vol. 49, No. 12, Dec. 2001, pp. 2431-2436.*
Ito et al., "60-GHz-band Dielectric Waveguide Filters with Cross-coupling for Flip-chip Modules", Microwave Symposium Digest, 2002 IEEE MTT-S International, vol. 3, Jun. 2-7, 2002, pp. 1789-1792.*

* cited by examiner

*Primary Examiner*—Seungsook Ham
(74) *Attorney, Agent, or Firm*—Sughrue Mion, PLLC

(57) ABSTRACT

An oscillator comprising a dielectric resonator (DR) has a high controllability and reproducibility of coupling between the dielectric resonator (DR) and an oscillation circuit, and an integrated circuit is reduced in size. The dielectric resonator (DR) (1) is composed of a dielectric substrate (2), grounding conductive layers (3a, 3b) formed on both sides of the dielectric substrate (2), and via holes (4a) for electrical connection between the conductive layers. A coupling element (7a) composed of a slot (5a) provided in the central portion of the grounding conductive layer (3a) and a patch (6a) surrounded by the slot (5a) is coupled to the dielectric resonator (DR) (1). The patch (6a) is connected to a transmission line (13a) on an oscillation circuit (9) through a bump (8). The transmission line (13a) is connected to the ground through a termination resistor (15a). On the oscillation circuit MMIC (9), the transmission line (13a) is connected to the gate of a transistor FET (14) A capacitive transmission line (13a) for positive feedback is connected to the transistor FET (14). The output of the transistor FET (14) is connected to a transmission line (13c) for output through a matching circuit (16). The transmission line (13c) is bump-connected to a coplanar line (12a) composed of a signal conductive layer (11a) formed on an edge of the dielectric resonator (DR) (1) and the grounding conductive layer (3a).

19 Claims, 19 Drawing Sheets

PRIOR ART

DIELECTRIC RESONATOR, DIELECTRIC RESONATOR FREQUENCY ADJUSTING METHOD, AND DIELECTRIC RESONATOR INTEGRATED CIRCUIT

FIELD OF THE INVENTION

The present invention relates to a dielectric resonator which is used in a microwave band and in a millimeter wave band, a frequency adjustment method for the waves of the bands, and an integrated circuit using the dielectric resonator.

BACKGROUND OF THE INVENTION

All of patents, patent applications, patent publications, scientific articles and the like, which will hereinafter be cited or identified in the present application, will hereby be incorporated by references in their entirety in order to describe more fully the state of the art, to which the present invention pertains.

A dielectric resonator (DR) is used in an oscillator used in a microwave band and in a millimeter wave band for increasing stabilities for a phase noise and the frequency. FIG. 1 is an equivalent circuit showing a configuration of the oscillator using the dielectric resonator (DRO) according to one conventional example. For obtaining a negative resistance, a capacitive micro strip line 28b is connected to a source of transistor FET 14. A micro strip line 28a extending from a gate of transistor FET 14 is inductively coupled with a dielectric resonator 1 having TE01d mode of cylindrical shape. In this configuration, a coupling rate is adjusted by a distance between dielectric resonator 1 and micro strip line 28a. Electromagnetic waves from transistor FET 14 are reflected at a resonant frequency of dielectric resonator 1, and absorbed with termination resistor 15a at a frequency other then the resonant frequency. Therefore, there exists a large negative resistance at the resonant frequency. Matching circuit 16 (which comprises a transmission line and a capacitor) being designed to comply an oscillation condition is connected to a drain of transistor FET 14. Gate bias 17a and drain bias 17b of transistor FET 14 are applied through resistor 15b of several kO and matching circuit 16, respectively. In addition, a resonant frequency is finely tuned by varactor diode 20 connected to one terminal of micro strip line 28c which is inductively coupled with dielectric resonator 1. Capacitor 21a having a low reactance at an operating frequency is connected to one side of varactor diode 20, add resistor 15c having several kO which is DC grounded is connected to the other side. In this configuration, because the resonant frequency of dielectric resonator 1 is determined by an outside dimension of the resonator, a high machining accuracy is required for the resonator. Also, since the coupling rate is tuned by the distance between dielectric resonator 1 and micro strip line 28a, a high positioning accuracy (0.1 mm) of dielectric resonator 1 is required. In addition, as a electromagnetic field is spread out of the resonator, the oscillation frequency is easily changed when the resonator is mounted on a package.

Then, as a bonding structure of a dielectric resonator and a transmission line, a structure shown in FIG. 2 has been proposed in Japanese Laid-open Patent Publication No. 11-145709. FIG. 2 is an exploded perspective view showing a bonding structure of a dielectric resonator and a transmission line according to another conventional example. Dielectric resonator 1 comprises dielectric substrate 30 and conductive plates 29a, 29b. Conductor layers 31a, 31b having circular apertural parts facing to each other are formed on both upper surface and bottom surface of dielectric substrate 30. Dielectric layer 32 is formed on conductive layer 31a using a thin film formation technology. In addition, signal conductive layer 33 is formed on dielectric layer 32. In this configuration, the apertural part of dielectric substrate 30 operates as a resonator. In the Japanese Laid-open Patent Publication No. 11-145709, as with the configuration in FIG. 1, the coupling rate is tuned by a distance between the resonator and signal conductive layer 33. However, because a position of signal conductive layer 33 can be controlled accurately using a thin film formation technology, a variation of the coupling rate is small.

On the other hand, in the example of the Japanese Laid-open Patent Publication No. 11-145709, even though spread of the electromagnetic filed out of the resonator is small compared with a dielectric resonator which has a cylindrical shape, the electromagnetic filed also spreads out upward and bottomward. Therefore, it has been necessary that, for example, lines and a transistor FET other than a resonator, which compose the oscillator, have to be arranged keeping some distance from the resonator. That is, the lines and the transistor FET can not be disposed in upward and bottomward of the resonator, thereby resulting in large size of the circuit. In addition, for the purpose of electrical shielding, conductive plates 29a, 29b covering a resonator portion are separately needed as shown in FIG. 2.

DISCLOSURE OF THE INVENTION

It is therefore an object of the present invention to provide a dielectric resonator which is free from the above issues.

It is another object of the present invention to provide an integrated circuit having a dielectric resonator which is free from the above issues.

According to a first aspect of the present invention, the present invention provides a dielectric resonator which has an effective resonant area extending in three dimensions confining electromagnetic waves, wherein the dielectric resonator comprising at least one coupling element, the at least one coupling element further comprising: at least one slot formed on at least one conductive surface extending in two dimensions on at least a part of peripheral surface of the effective resonant area; and at least one patch conductive area adjacent to the at least one slot.

It is favorable that an inside of the effective resonant area is composed of a dielectric substance, on the other hand, a periphery of the effective resonant area is composed of a conductive structure extending in two dimensions not to form a space beyond ½ of a wave length of the electromagnetic waves at a resonant frequency, and the at least one conductive surface forms a part of the conductive structure.

Also, it is favorable that the conductive structure extending to the periphery of the effective resonant area comprises a first conductive layer extending on a first surface of a dielectric substrate, a second conductive layer extending on a second surface of the dielectric substrate, and at least one buried conductor buried in the dielectric substrate.

Further, it is favorable that the at least one buried conductor comprises a plurality of buried conductors extending circularly and discontinuously if it is seen on a surface of the dielectric substrate, and a distance between the plurality of buried conductors is equal to or less than ½ of the wave length at the resonant frequency.

Furthermore, it is favorable that the plurality of buried conductors is a plurality of via plugs formed in a plurality of via holes passing through the dielectric substrate for connecting the first conductive layer and the second conductive layer, and a distance between the plurality of via plugs is equal to or less than ½ of the wave length at the resonant frequency.

The at least one buried conductor may be configured with buried conductors extending circularly and discontinuously if it is seen on a surface of the dielectric substrate The at least one slot may be formed on at least any one of the first conductive layer and the second conductive layer.

The at least one conductive surface comprises the first conductive layer, and at least one apertural part may be formed on an area of the second conductive layer corresponding to an area of the first conductive layer where the at least one coupling element exists if the areas are seen on the surfaces of the dielectric substrate. The at least one apertural part may be consist of a plurality of apertural parts with different sizes. In addition, the plurality of apertural parts may be arranged in a concentric fashion. The at least one apertural part may be filled with a conductive material.

The slot may be formed to surround at least a part, of the patch conductive area. The slot may be formed to entirely surround the patch conductive area.

The at least one coupling element may be consist of a plurality of coupling elements. The plurality of coupling elements may be consist of a plurality of same kinds of coupling element. The plurality of coupling elements may be consist of a plurality of different kinds of coupling element.

The dielectric resonator may further comprise at least one coplanar line formed on an area other than the effective resonant area.

The dielectric resonator may further comprise at least one coplanar line formed in the effective resonant area.

The dielectric resonator may further comprise at least one coplanar line formed in an area where the coupling element is formed.

The dielectric resonator may further comprise at least one signal conductive layer formed in an area where the coupling element exists so as to be adjacent to the at least one slot, and the at least one signal conductive layer may configure at least one coplanar line.

The at least one signal conductive layer may further be adjacent to the at least one patch conductive area. The at least one signal conductive layer may further overlap with at least a part of the at least one patch conductive area.

The at least one coupling element may be connected to a negative resistance generating circuit through at least one conductive contact. The conductive contact may be a conductive bump.

According to a second aspect of the present invention, the present invention provides an integrated circuit comprising: a dielectric resonator which has an effective resonant area extending in three dimensions confining electromagnetic waves, wherein the dielectric resonator comprises at least one coupling element, the at least one coupling element comprising at least one slot formed on at least one conductive surface extending in two dimensions on at least a part of peripheral surface of the effective resonant area and at least one patch conductive area adjacent to the at least one slot; and at least one negative resistance generating circuit connected to the at least one coupling element through at least one conductive contact.

The conductive contact may be consist of a conductive bump.

It may be configured so that the at least one negative resistance generating circuit is formed on a first circuit substrate and includes a first transmission line directly contacting to the at least one conductive contact.

It may be configured so that the at least one negative resistance generating circuit further includes a varactor diode formed on the first circuit substrate, and the at least one coupling element comprises a first coupling element connected to the first transmission line through a first conductive contact and a second coupling element connected to the varactor diode through a second conductive contact.

The at least one negative resistance generating circuit may configure an active device including at least one oscillation circuit. It may be configured so that the at least one conductive contact is bonded to a center part of the first transmission line, a first edge of the first transmission line is connected to the active device, and a second edge of the first transmission line is connected to a termination resistor. Also, it may be configured so that the at least one coupling element comprises a first coupling element connected to an output side of the active device through a first conductive contact and the first transmission line, and a second coupling element connected to a termination resistor through a second conductive contact and the first transmission line. Further, it may be configured so that the at least one coupling element comprises a first coupling element connected to an output side of the active device through a first conductive contact and the first transmission line, and a second coupling element connected to an output side of the active device through a second transmission line.

The first transmission line and a third transmission line formed on the first circuit substrate may be connected through a conductive bump.

The first transmission line and a fourth transmission line formed on a second circuit substrate may be connected through a conductive bump.

It may be configured so that a concave portion is formed on the second circuit substrate, and the first circuit substrate mounted on the dielectric resonator is put in the concave portion. It may be configured so that the first circuit substrate is encapsulated in the concave portion of the second circuit substrate with a resin sealing a space between the second circuit substrate and the dielectric resonator.

It may be configured so that an inside of the effective resonant area is composed of a dielectric substance, on the other hand, a periphery of the effective resonant area is composed of a conductive structure extending in two dimensions not to form a space beyond ½ of a wave length of the electromagnetic waves at a resonant frequency, and the at least one conductive surface forms a part of the conductive structure.

It may be configured so that the conductive structure extending to the periphery of the effective resonant area, comprising: a first conductive layer extending to a first surface of a dielectric substrate; a second conductive layer extending to a second surface of the dielectric substrate; and at least one buried conductor buried in the dielectric substrate.

It may be configured so that the at least one buried conductor comprises a plurality of buried conductors extending circularly and discontinuously if it is seen on a surface of the dielectric substrate, and a distance between the plurality of buried conductors is equal to or less than ½ of the wave length at the resonant frequency.

It may be configured so that the plurality of buried conductors is a plurality of via plugs formed in a plurality of via holes passing through the dielectric substrate for connecting the first conductive layer and the second conductive layer, and a distance between the plurality of via plugs is equal to or less than ½ of the wave length at the resonant frequency.

According to a third aspect of the present invention, the present invention provides a dielectric resonator comprising: a dielectric substrate; a first conductive layer formed on a first surface of the dielectric substrate; a second conductive layer formed on a second surface of the dielectric substrate; a plurality of via plugs filling a plurality of via holes arranged circularly and discontinuously if it seen on a surface of the dielectric substrate as well as passing through the dielectric substrate at intervals of equal to or less than ½ of a wave length of the electromagnetic waves at a resonant frequency; an effective resonant area extending in three dimensions and defined by the first and the second conductive layers and the plurality of buried conductors for confining the electromagnetic waves; and at least one coupling element formed on the first conductive layer in the effective resonant area, wherein the at least one coupling element includes at least one slot formed on the first conductive layer and at least one patch conductive area adjacent to the at least one slot.

It may be configured so that the at least one conductive surface comprises the first conductive layer, and at least one apertural part is formed on an area of the second conductive layer corresponding to an area of the first conductive layer where the at least one coupling element exists if the areas are seen on the surfaces of the dielectric substrate. The at least one apertural part may be consist of a plurality of apertural parts with different sizes. The plurality of apertural parts may be arranged in a concentric fashion. The at least one apertural part may be filled with a conductive material.

The at least one coupling element may be consist of a plurality of same kinds of coupling element.

The at least one coupling element may be consist of a plurality of different kinds of coupling element.

It may be configured so that a dielectric resonator further comprises at least one coplanar line formed at outside of the effective resonant area.

It may be configured so that a dielectric resonator further comprises at least one coplanar line formed in the effective resonant area.

It may be configured so that a dielectric resonator further comprises at least one coplanar line formed in an area where the coupling element is formed.

It may be configured so that a dielectric resonator further comprises at least one signal conductive layer formed in an area where the coupling element exists so as to be adjacent to the at least one slot, and the at least one signal conductive layer configures at least one coplanar line. It may be configured so that the at least one signal conductive layer is further adjacent to the at least one patch conductive area. Also, it may be configured so that the at least one signal conductive layer partially overlaps with at least a part of the at least one patch conductive area.

It may be configured so that the at least one coupling element is connected to a negative resistance generation circuit through at least one conductive contact. The conductive contact may be consist of a conductive bump.

According to a fourth aspect of the present invention, the invention provides an integrated circuit comprising: a dielectric substrate; a first conductive layer formed on a first surface of the dielectric substrate; a second conductive layer formed on a second surface of the dielectric substrate; a plurality of via plugs filling a plurality of via holes arranged circularly and discontinuously if it seen on a surface of the dielectric substrate as well as passing through the dielectric substrate at intervals of equal to or less than ½ of a wave length of the electromagnetic waves at a resonant frequency; an effective resonant area extending in three dimensions and defined by the first and the second conductive layers and the plurality of buried conductors for confining the electromagnetic waves; and at least one coupling element formed on the first conductive layer in the effective resonant area, wherein the at least one coupling element comprising: a dielectric resonator including at least one slot formed on the first conductive layer and at least one patch conductive area adjacent to the at least one slot; and an oscillation circuit including a first transmission line connected to the at least one coupling element with a conductive bump as well as formed on a first circuit substrate.

It may be configured so that the oscillation circuit further comprises a varactor diode formed on the first circuit substrate, and the at least one coupling element comprises a first coupling element connected to the first transmission line through a first conductive bump and a second coupling element connected to the varactor diode though a second conductive bump. It may be configured so that a first edge of the first transmission line is connected to the oscillation circuit, and a second edge of the first transmission line is connected to a termination resistor.

Also, it may be configured so that the at least one coupling element comprises a first coupling element connected to an output side of the oscillation circuit through a first conductive bump and the first transmission line, and a second coupling element connected to a termination resistor through a second conductive bump and the first transmission line.

Further, it may be configured so that the at least one coupling element comprises a first coupling element connected to an output side of the oscillation circuit through a first conductive bump and the first transmission line, and a second coupling element connected to an output side of the oscillation circuit through a second transmission line. It may be configured so that the first transmission line and a third transmission line formed on the first circuit substrate are connected through a conductive bump.

It may be configured so that the fast transmission line and a fourth transmission line formed on a second circuit substrate are connected through a conductive bump.

It may be configured so that a concave portion is formed on the second circuit substrate, and the first circuit substrate mounted on the dielectric resonator is put in the concave portion. It may be configured so that the first circuit substrate is encapsulated in the concave portion of the second circuit substrate with a resin sealing a space between the second circuit substrate and the dielectric resonator.

EMBODIMENTS OF THE PRESENT INVENTION

Embodiments of the present invention will be explained in detail by referring to figures.

First Embodiment

Figure 1:
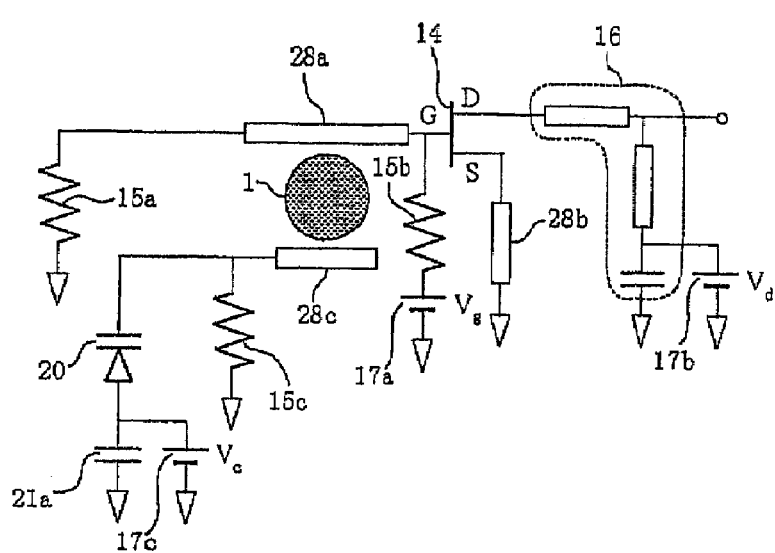
FIG. 1 is an equivalent circuit showing a configuration of an oscillator using a dielectric resonator (DRO) according to one conventional example.
Figure 2:
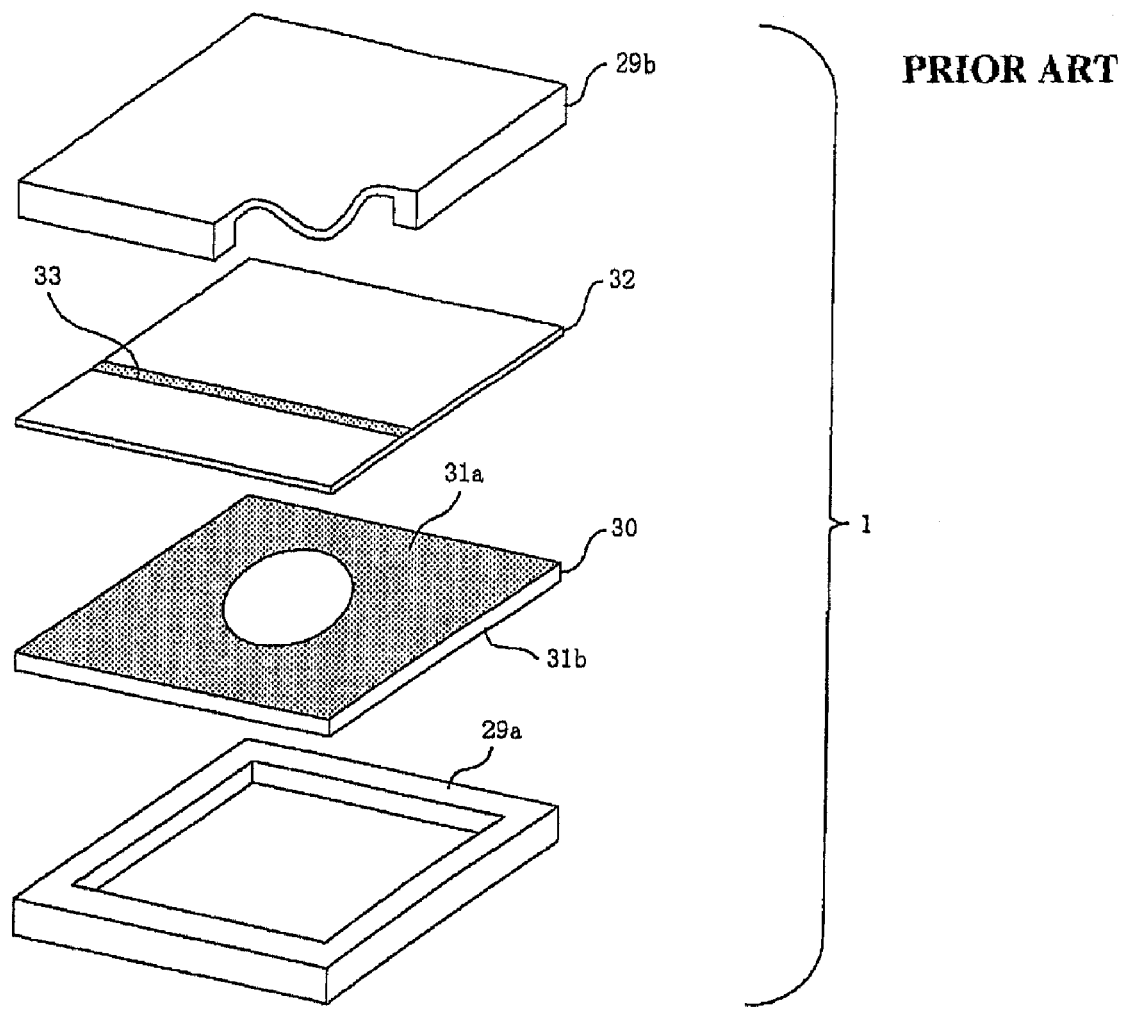
FIG. 2 is an exploded perspective view showing a bonding structure between a dielectric resonator and a transmission line according to a conventional example.
Figure 3A:
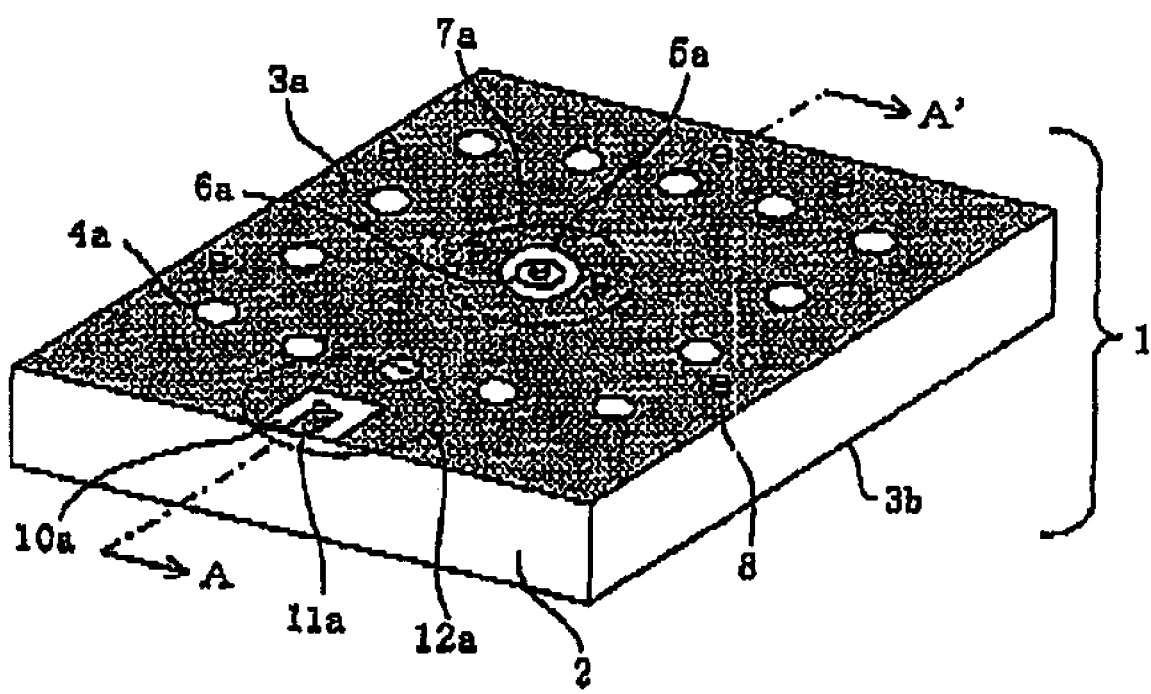
FIG. 3A is a perspective view showing a dielectric resonator in a first configuration example of a first embodiment of the present invention.
Figure 3B:
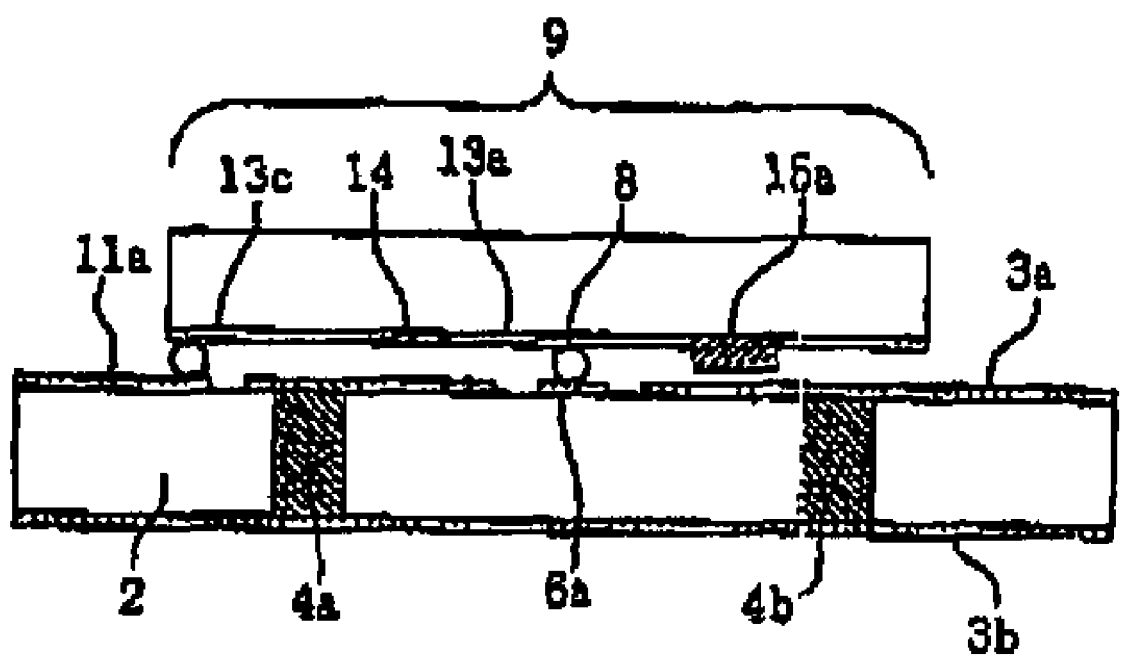
FIG. 3B is a traverse cross sectional view at A-A' dashed line in FIG. 3A showing an oscillator (DRO) having a dielectric resonator.
Figure 3C:
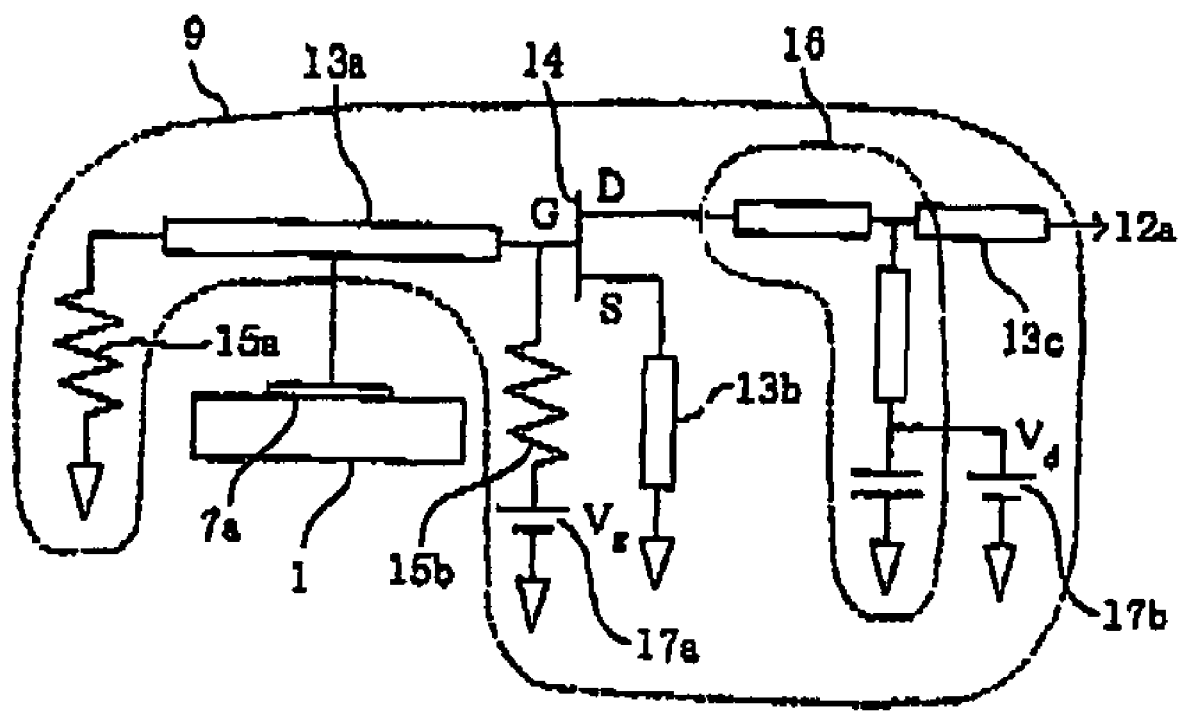
FIG. 3C is an equivalent circuit of an oscillator (DRO) having a dielectric resonator shown in FIG. 3A.

FIG. 3A is a perspective view showing a dielectric resonator in a first configuration example of a first embodiment of the present invention. FIG. 3B is a traverse cross sectional view at A-A' dashed line in FIG. 3A showing an oscillator (DRO) having a dielectric resonator. FIG. 3C is an equivalent circuit of an oscillator (DRO) having a dielectric resonator shown in FIG. 3A. Dielectric resonator 1 is configured such that ground conductive layers 3a, 3b are formed on both sides of dielectric substrate 2, and the both conductive layers are connected with plug conductor 4b filling circularly-arranged via hole 4a. It is favorable that a distance between via holes 4a is less than ½, more favorably less than ¼ of a wave length in the dielectric substrate for suppressing leakage of the wave from a clearance between the via holes. A region surrounded by the via holes and ground conductive layers 3a, 3b is named an effective resonant region. In this configuration, dielectric resonator 1 is a TE110 mode resonator at base operation. Coupling element 7a consisting of slot 5a at a center part of ground conductive layer 3a and patch 6a surrounded by slot 5a is inductively coupled with dielectric resonator 1. A coupling rate is tuned by a width of slot 5a, a size of patch 6a, and a position of patch 6a. Since coupling element 7a is fabricated using, for example, a photolithography, a controllability of the coupling rate is high. In this embodiment, electromagnetic waves are confined almost in the effective resonant area of dielectric substrate 2. Accordingly, as shown in FIG. 3B, oscillator circuit 9 can be mounted on the resonator with a flip chip bonding without effecting on a performance of the resonator, thereby resulting in achieving miniaturization.

Next, an oscillator (DRO) having a dielectric resonator of the present embodiment will be explained. Patch 6a and transmission line 13a on oscillator circuit 9 are bonded through bump 8. Practically, a flip chip bonding is implemented. Transmission line 13a is grounded through termination resistor 15a. Then, only a resonant frequency is reflected, and the electromagnetic waves other than the resonant frequency are absorbed with termination resistor 15a. In oscillation circuit MMIC 9, transmission line 13a is connected to a gate of transistor FET 14, which is an active device. For obtaining a negative resistance, capacitive transmission line 13b for positive feedback is connected to transistor FET 14. A drain of transistor FET 14 is connected to output transmission line 13c through matching circuit 16 consisting of a transmission line and a capacitor. Gate bias 17a and drain bias 17b of transistor FET 14 are applied through resistor 15b of several kO and matching circuit 16, respectively. Output transmission line 13c of oscillation circuit 9 is bonded with a bump to coplanar line 12a consisting of signal conductive layer 11a formed at the end of the substrate of dielectric resonator 1 and ground conductive layer 3a arranged to sandwich slot 10a. With this configuration, a signal of an oscillator (DRO) is transmitted from coplanar line 12a. Thus, in the configuration of the present embodiment, output coplanar line 12a is disposed at outside of the effective resonant area, where is surrounded by through hole columns 4a, of the dielectric substrate. Then, an apertural area is located only in coupling element 7a on the resonator. As a result, a lowering of Q of the resonator due to fluctuation of the electromagnetic field at the apertural area can be minimized.

Figure 4A:
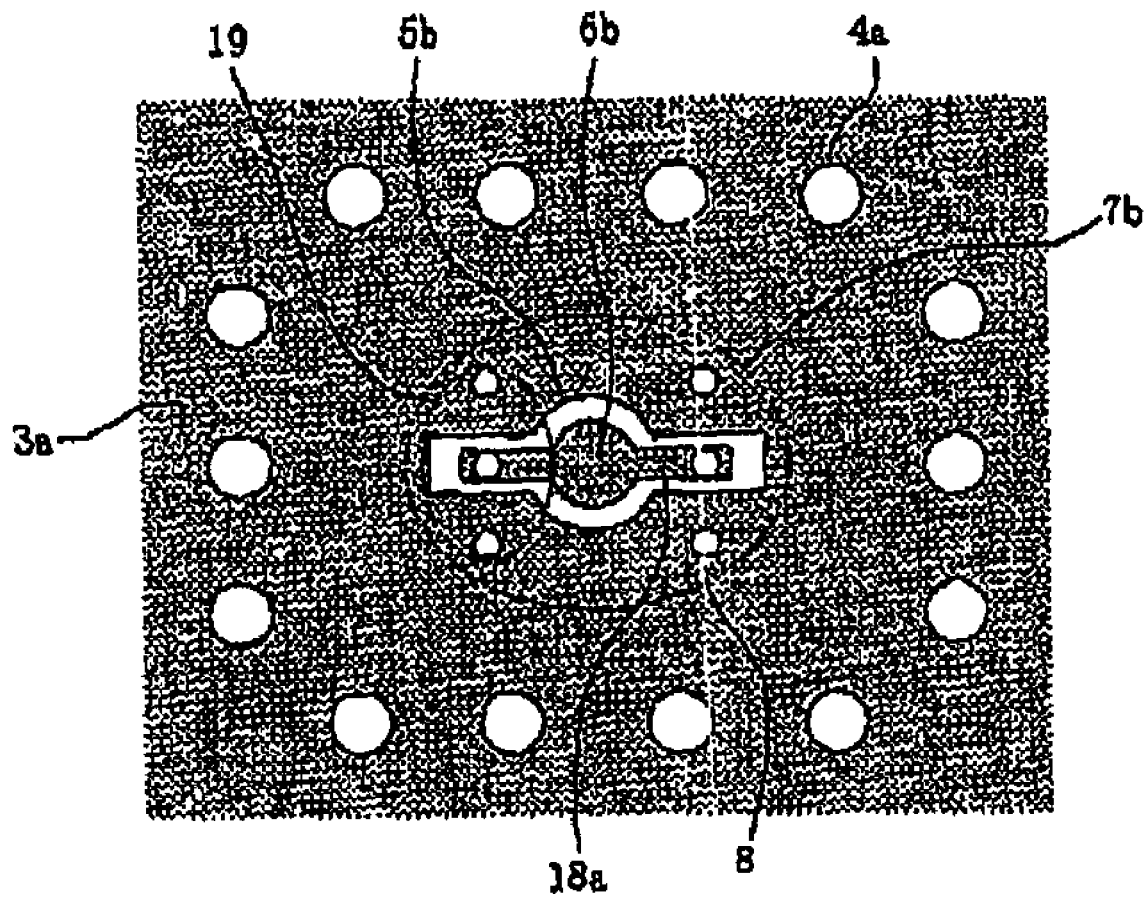
FIG. 4A is a plane view showing a resonator part in a second configuration example of a first embodiment of the present invention.
Figure 4B:
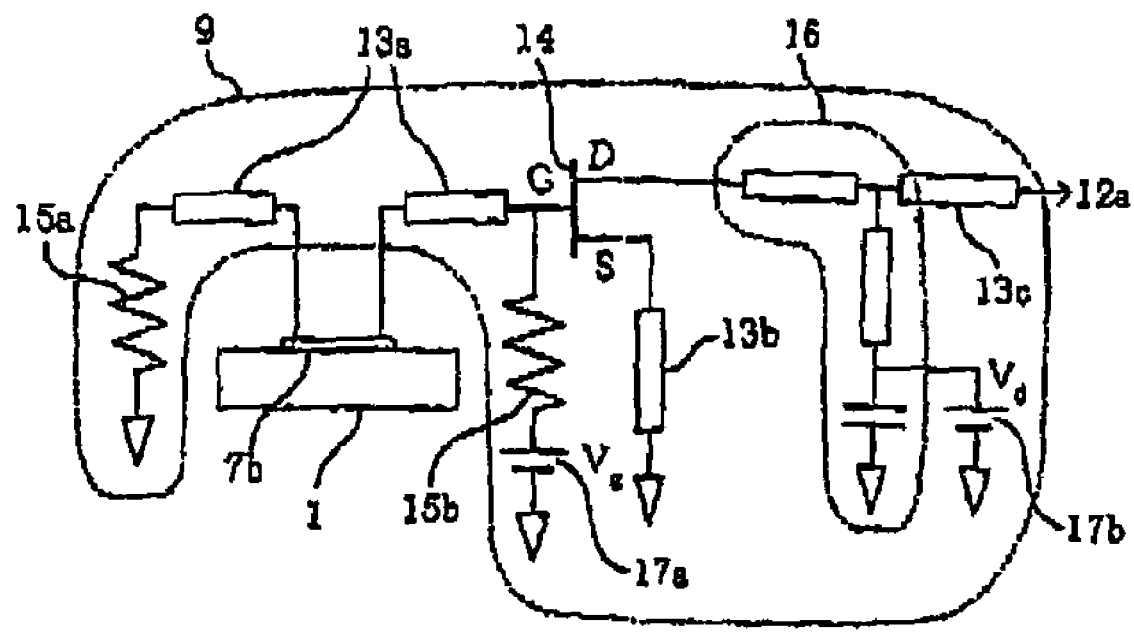
FIG. 4B is an equivalent circuit of an oscillator (DRO) having a dielectric resonator shown in FIG. 4A.

FIG. 4A is a plane view showing a resonator part in a second configuration example of the first embodiment of the present invention. FIG. 4B is an equivalent circuit of an oscillator (DRO) having a dielectric resonator shown in FIG. 4A. A coupling element may be, as shown in FIG. 4A, coupling element 7b connected two coplanar lines 19, which comprises ground conductive layer 3a arranged to sandwich slot 5b with signal conductive layer 18a, to patch 6b. In this case, as shown in FIG. 4B, coupling element 7b is connected in series to transmission line 13a which is connected to a gate of transistor FET 14. Therefore, a large coupling rate is easily obtained compared with the case (coupling element 7a) in which a coupling element is connected in shunt to the gate through a bump having an inductance component. In addition, since coplanar line 19 is connected to coupling element 7b, on-wafer evaluation can be easily conducted before mounting oscillation circuit MMIC 9 on dielectric resonator 1.

Figure 5:
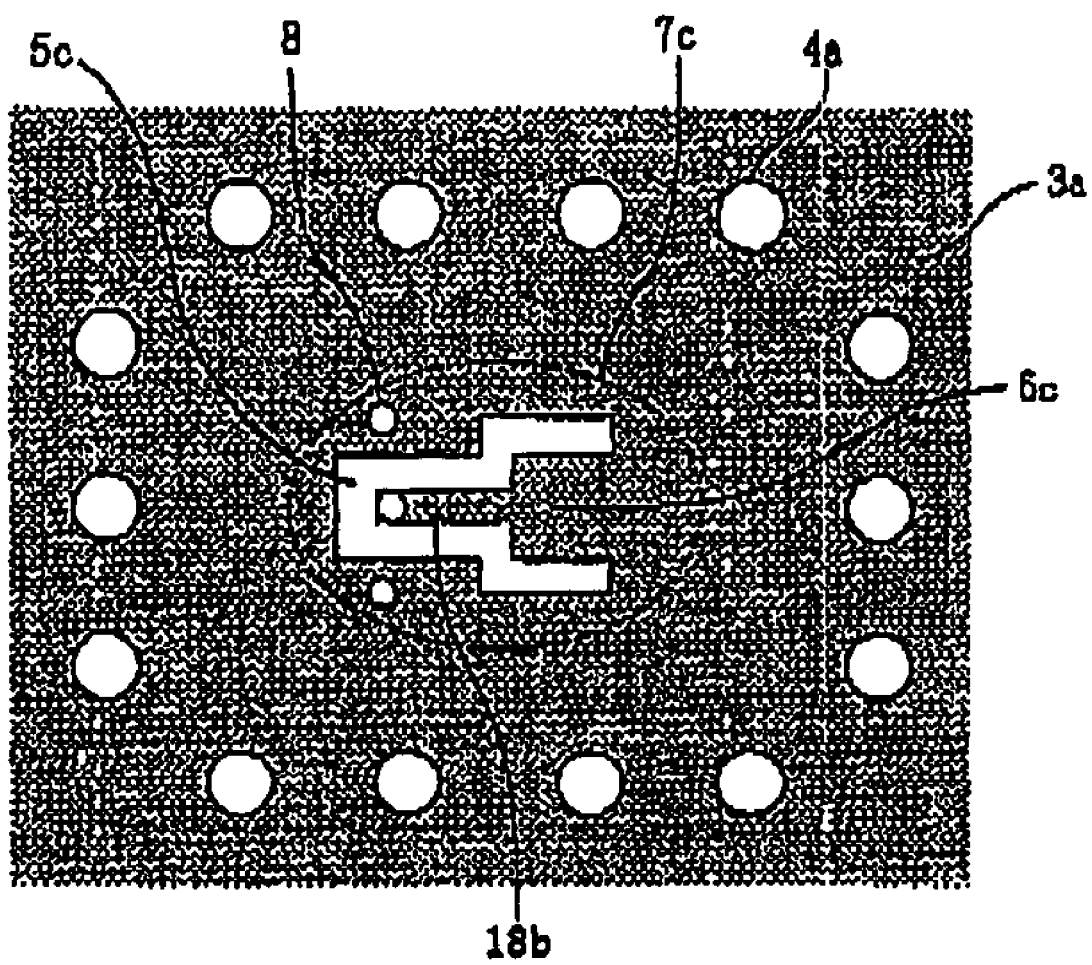
FIG. 5 is a plane view showing a resonator part of a third configuration example of a first embodiment.

FIG. 5 is a plane view showing a resonator part of a third configuration example of the first embodiment. The coupling element may be, as shown in FIG. 5, coupling element 7c configured by disposing patch 6c by forming slot 5c in ground conductive layer 3a. In patch 6c, signal conductive layer 18b composing a coplanar line together with ground conductive layer 3a may be connected. In the case of coupling element 7c, since the reflection occur in all frequencies, it is necessary not to generate oscillation at an unnecessary frequency, while termination resistor 15a is not needed.

A TE110 mode resonator has been shown this time, however, the present invention is applicable to a resonator having a higher mode of, for example, TE210 mode.

Second Embodiment

Figure 6A:
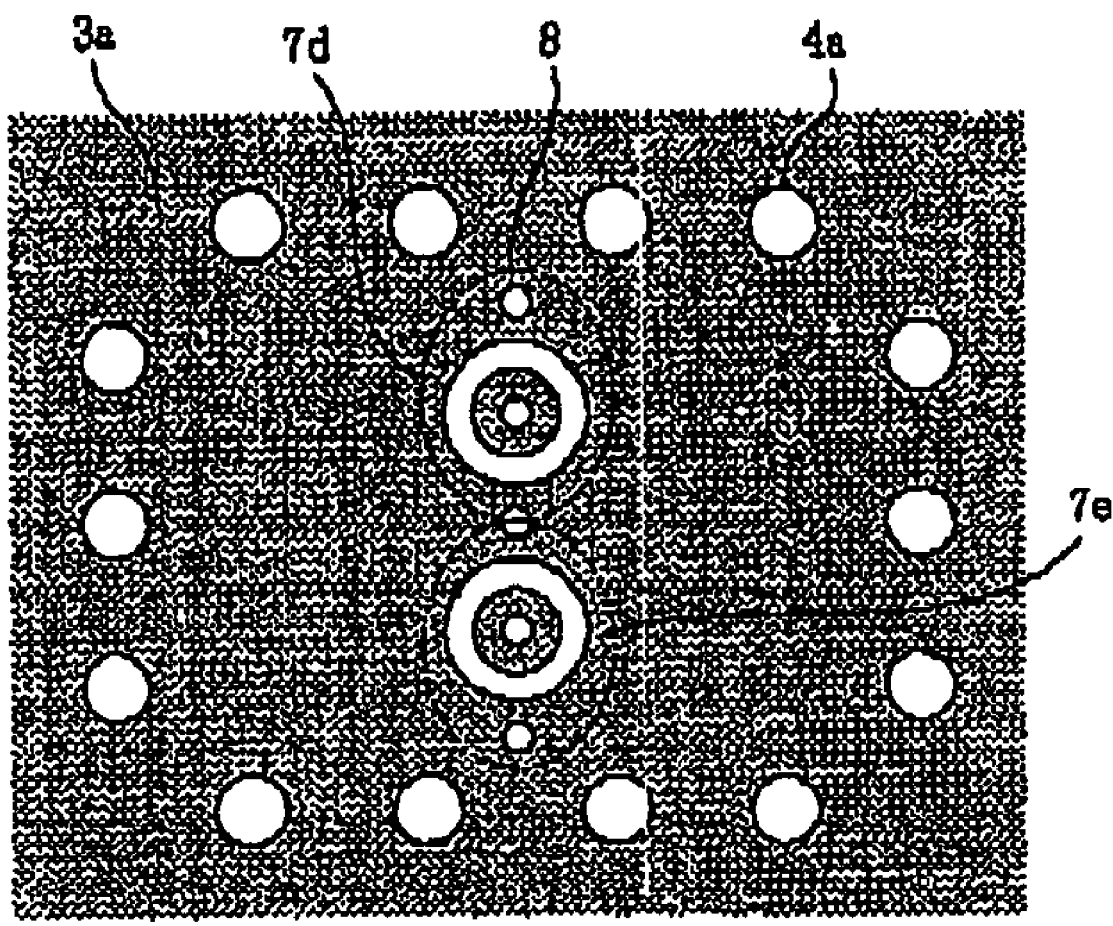
FIG. 6A is a plane view showing a dielectric resonator of a first configuration example in a second embodiment according to the present invention.
Figure 6B:
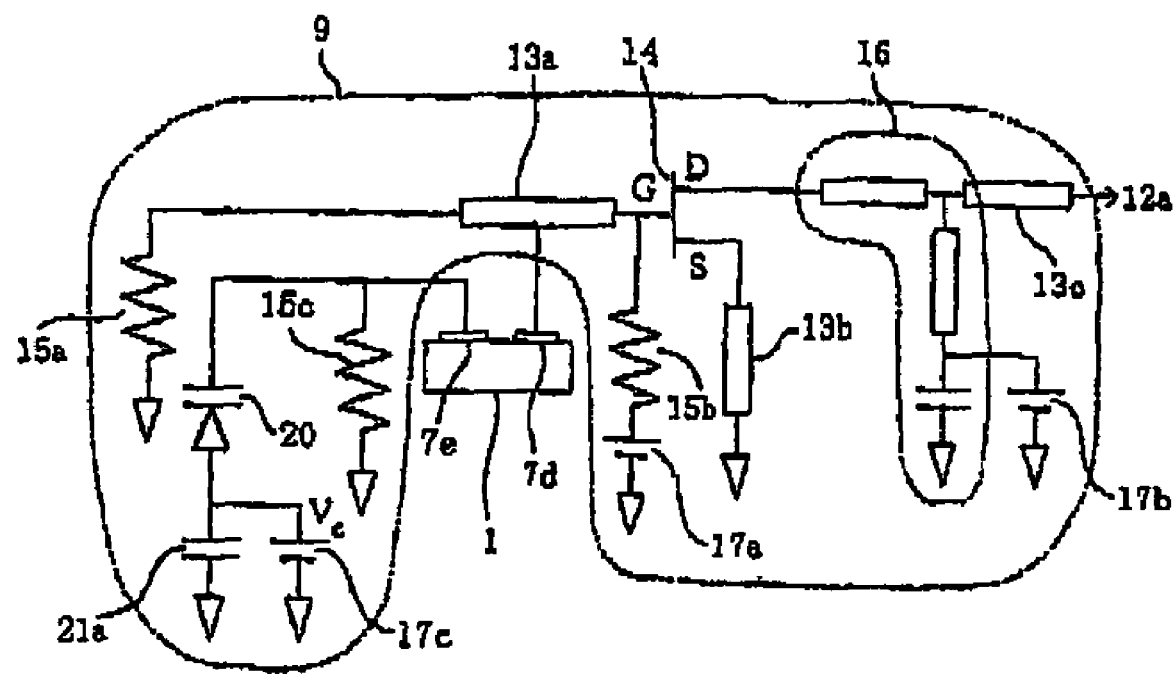
FIG. 6B is an equivalent circuit of an oscillator (DRO) having a dielectric resonator shown in FIG. 6A.

FIG. 6A is a plane view showing a dielectric resonator of a first configuration example in a second embodiment according to the present invention. FIG. 6B is an equivalent circuit of an oscillator (DRO) having the dielectric resonator shown in FIG. 6A. As the second embodiment, a configuration capable of electrically tuning a frequency of the oscillator (DRO) having the dielectric resonator will be shown. Two coupling elements 7d, 7e are formed on ground conductive layer 3a. Coupling element 7d is connected to transmission line 13a extending from a gate of transistor FET 14, and coupling element 7e is connected to varactor diode 20 formed on oscillation circuit MMIC 9. For applying control voltage 17c to varactor diode 20, coupling element 7e is DC connected to the ground through resistor 15c having several ¯kO. In addition, capacitor 21a which has a low reactance at an operating frequency is connected to the opposite side of coupling element 7e. By varying control voltage 17c, a capacitance of varactor diode 20 call be varied, thereby resulting in capability of tuning a resonant frequency (oscillation frequency) of the resonator. It is possible to put a transmission line between coupling element 7e and varactor diode 20. In the above, an example in which coupling element 7e is employed as a coupling element with varactor diode 20 has been shown. However, coupling element 7c may also be employed, In this case, there is an advantage that resistor 15c is not necessary because a voltage of varactor diode 20 at coupling element 7c side is the ground voltage. Of course, a configuration of coupling element 7b instead of coupling element 7d may also be available.

Third Embodiment

Figure 7A:
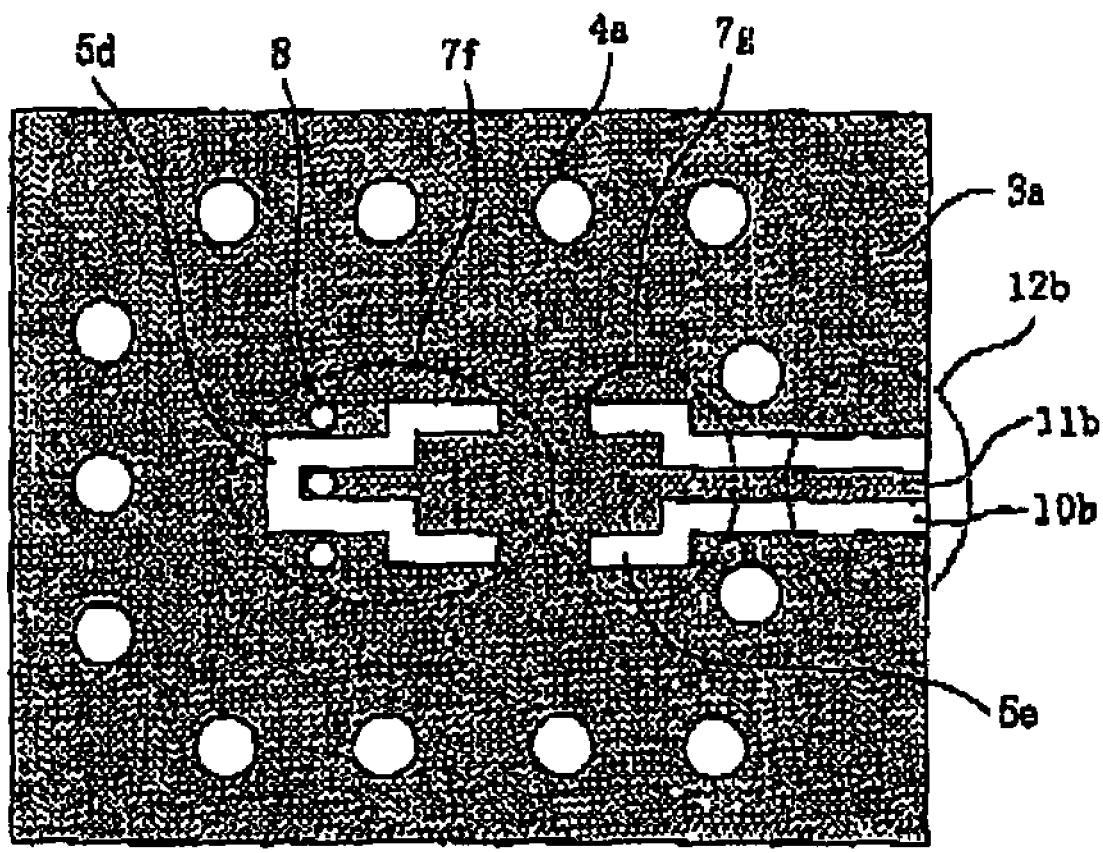
FIG. 7A is a plane view showing a dielectric resonator of a first configuration example of a third embodiment according to the present invention.
Figure 7B:
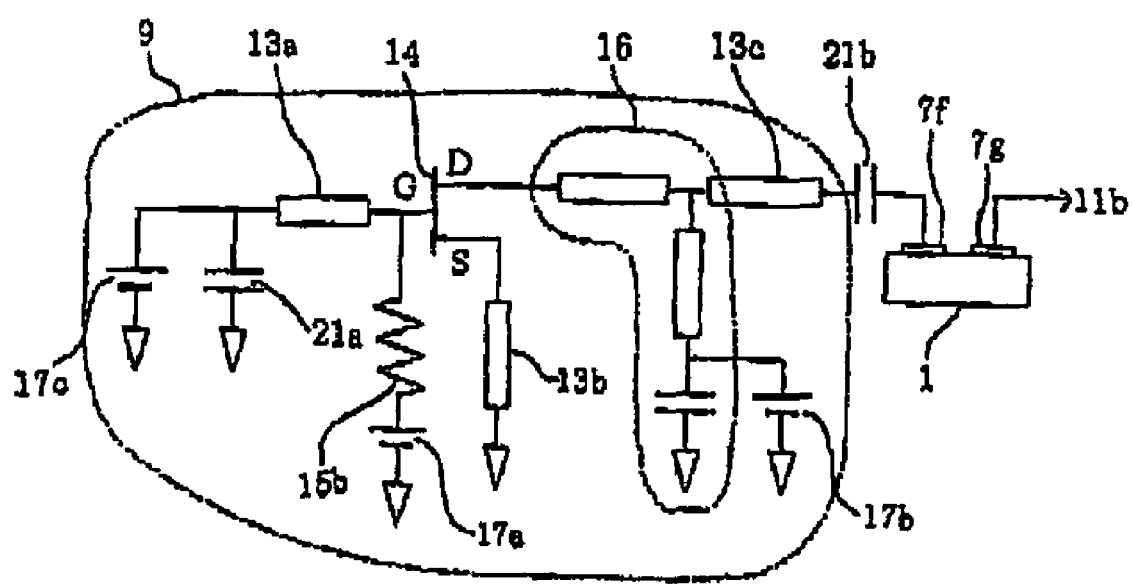
FIG. 7B is an equivalent circuit of an oscillator (DRO) having a dielectric resonator shown in FIG. 7A.

FIG. 7A is a plane view showing a dielectric resonator of a first configuration example of a third embodiment according to the present invention. FIG. 7B is an equivalent circuit of an oscillator (DRO) having the dielectric resonator shown in FIG. 7A. An output of oscillation circuit 9 is connected to coupling element 7f, which is configured by forming slot 5d in ground conductive layer 3a, through capacitor 21b having a low reactance at an operating frequency which cuts DC bias. In addition, coupling element 7g is disposed in ground conductive layer 3a by forming slot 5e. Coupling element 7g is connected to coplanar line 12b consisting of ground conductive layer 3a formed to sandwich slot 10b with signal conductive layer 11b by stepping over the inside and the outside of the resonator. In this configuration, dielectric resonator 1 only outputs a resonant frequency, and reflects all waves other than the resonant frequency. In a configuration of this embodiment, a configuration of oscillation circuit 9 forms a fundamental oscillator configuration, and a circuit design becomes easy.

Figure 8:
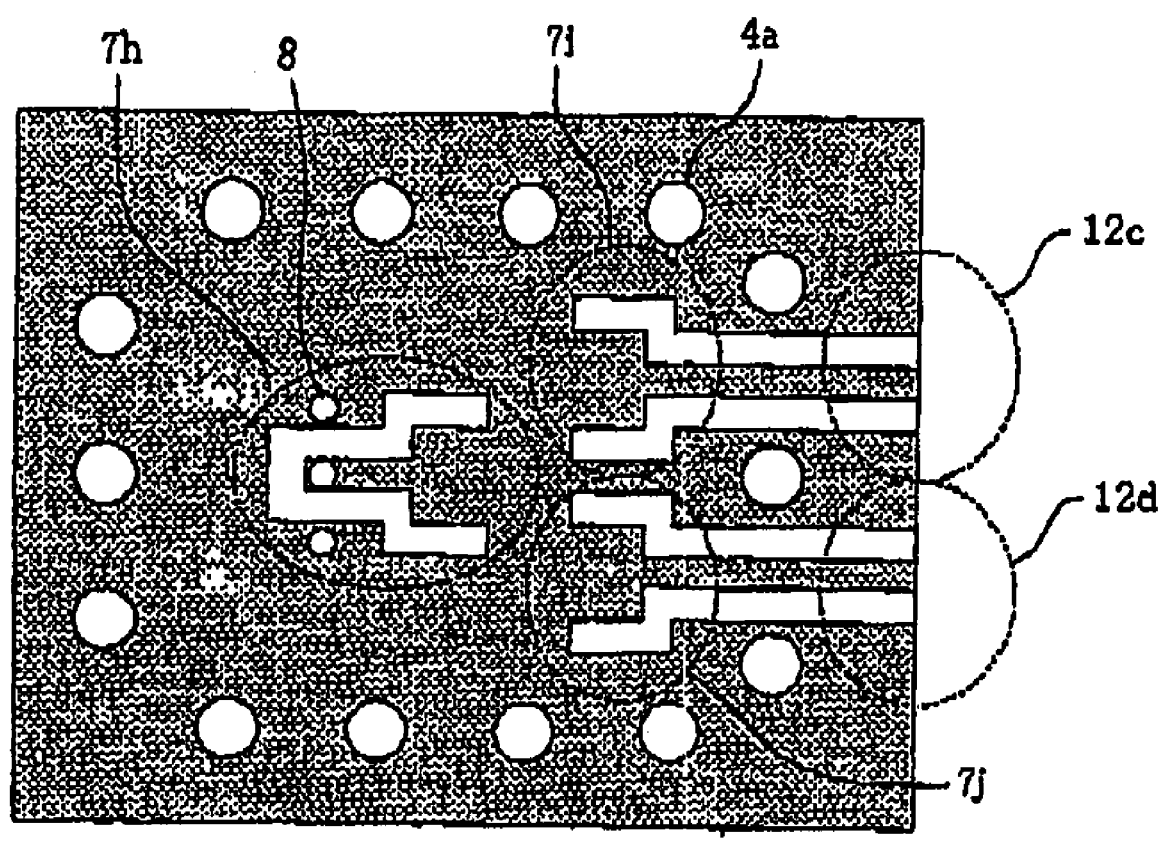
FIG. 8 is a plane view showing a dielectric resonator of a second configuration example of a third embodiment according to the present invention.

FIG. 8 is a plane view showing a dielectric resonator of a second configuration example of the third embodiment according to the present invention. Coplanar line for output may be disposed two as shown in FIG. 8. In this configuration, a signal inputted to dielectric resonator 1 through coupling element 7h is partially outputted to coplanar line 12c through coupling element 7i, and the other of the signal is outputted to coplanar line 12d through coupling element 7j. Thus, dielectric resonator 1 has a dividing function into two. Then, for example, in a case of heterodyne system, this can be used as a signal source of local oscillator for a transmitter and a receiver. In this case, a two dividing example has been shown, but not limited two. Dividing into three or more is also available by increasing the number of coupling elements.

Fourth Embodiment

Figure 9:
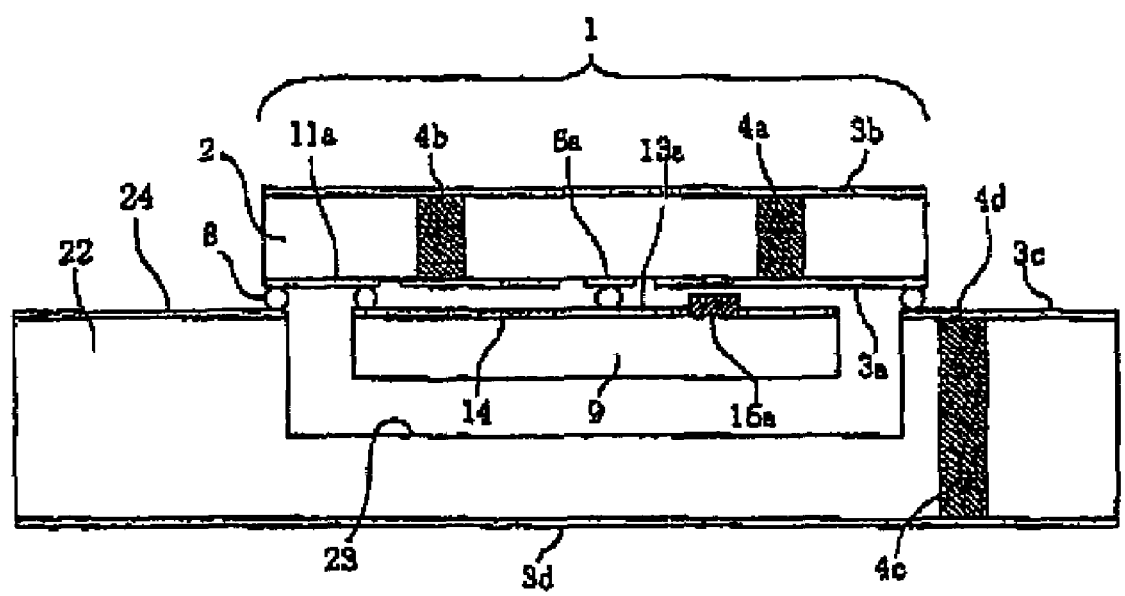
FIG. 9 is a traverse cross sectional view showing an oscillator (DRO) having a dielectric resonator of a first configuration example of a fourth embodiment according to the present invention.

FIG. 9 is a traverse cross sectional view showing an oscillator (DRO) having a dielectric resonator of a first configuration example of a fourth embodiment according to the present invention. Since the electromagnetic waves are almost completely confined in dielectric resonator 1, it is expected that the oscillation frequency does not change even if dielectric resonator 1, on which oscillator circuit 9 is mounted with a flip chip bonding, is further mounted on mounting substrate 22, such as a package, as shown in FIG. 9 by the flip chip bonding. Pit 23 is formed in mounting substrate 22, and oscillation circuit 9 is set inside of pit 23. Ground conductive layer 3d is formed on the backside surface of mounting substrate 22, and ground conductive layer 3c is formed on the surface of mounting substrate 22 except an area of signal conductive layer 24. Coplanar line 12a on dielectric resonator 1 is connected to a coplanar line consisting of signal conductive layer 24 on mounting substrate 22 and ground conductive layer 3c with bump 8. Ground conductive layers 3c and 3d are connected to each other through plug conductor 4d buried in via hole 4c, which is arranged along a periphery of pit 23. With the above configuration, an area in pit 23 where oscillation circuit 9 is set is electromagnetically shielded.

Figure 10:
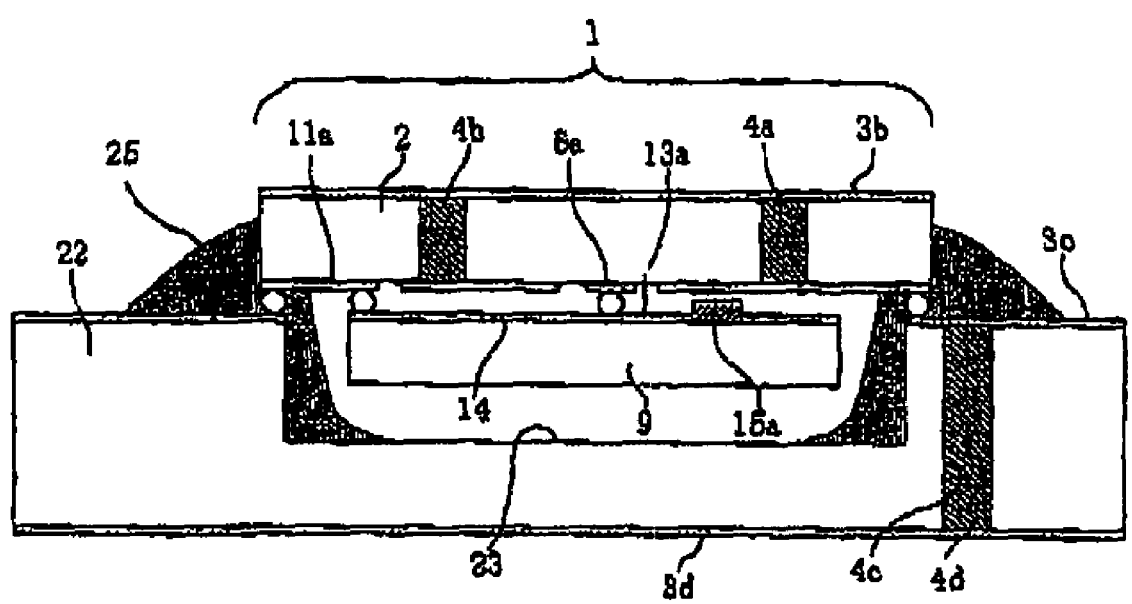
FIG. 10 is a traverse cross sectional view showing an oscillator (DRO) having a dielectric resonator of ti second configuration example of a fourth embodiment according to the present invention.

FIG. 10 is a traverse cross sectional view showing an oscillator (DRO) having a dielectric resonator of a second configuration example of the fourth embodiment according to the present invention. As shown in FIG. 10, an outer part of dielectric resonator 1 may be reinforced with, for example, thermosetting resin 25. In the configuration of the present invention, since pit 23 is formed in mounting substrate 22, resin 25 is not likely to get into an area of oscillation circuit MMIC 9, even if resin 25 is coated on the outer periphery. Accordingly, it is expected that the oscillation characteristic does not change by using resin 25.

Fifth Embodiment

Figure 11A:
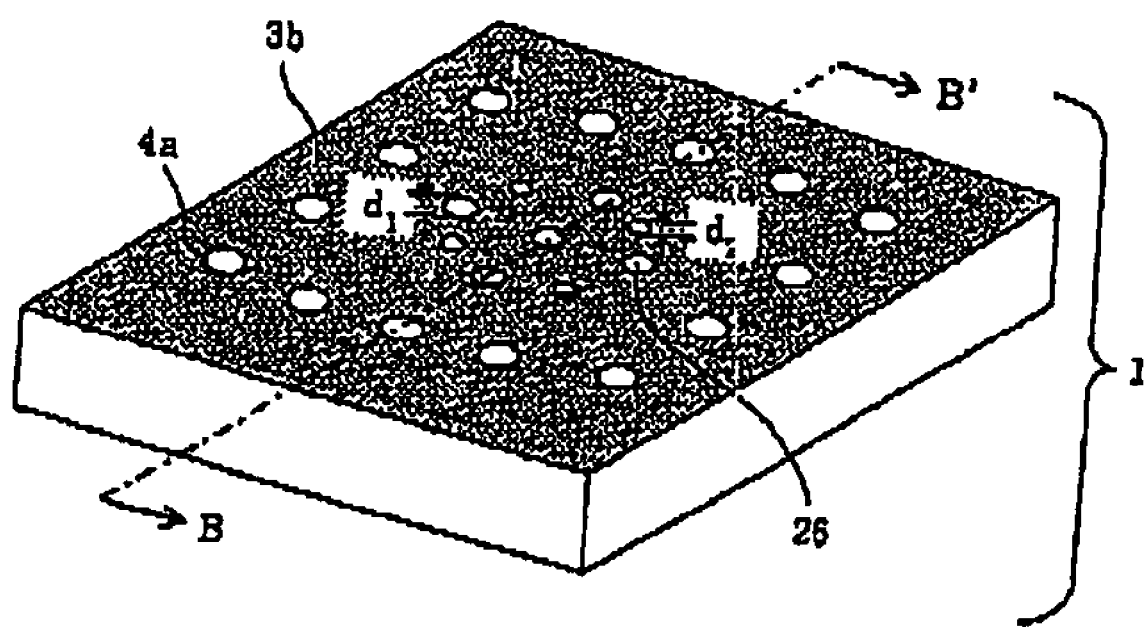
FIG. 11A is a perspective view showing a dielectric resonator of a first configuration example of a fifth embodiment according to the present invention.
Figure 11B:
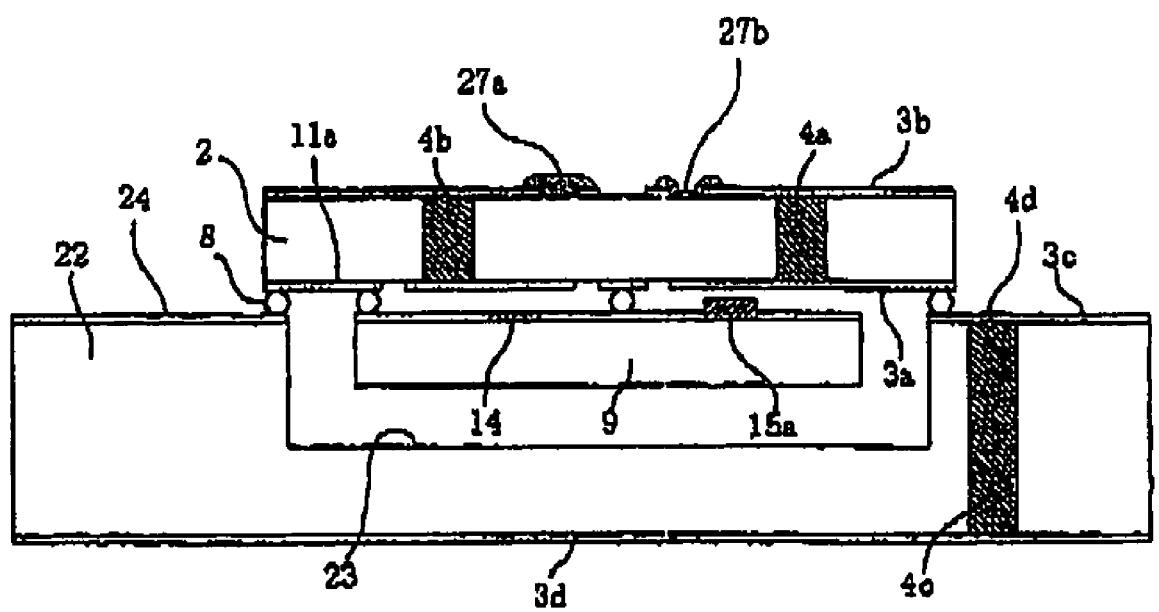
FIG. 11B is a traverse cross sectional view at dashed line B-B' of FIG. 11A showing an oscillator (DRO) having a dielectric resonator mounted with a flip chip bonding.

FIG. 11A is a perspective view showing a dielectric resonator of a first configuration example of a fifth embodiment according to the present invention. FIG. 11B is a traverse cross sectional view at dashed line B-B' of FIG. 11A, showing an oscillator (DRO) having a dielectric resonator mounted with flip chip bonding. If dielectric resonator 1 is mounted on mounting substrate 22 with flip chip bonding, a back surface of dielectric resonator 1 faces to air. As shown in FIG. 11A, a plurality of apertures 26 are formed on ground conductive layer 3b on the backside of dielectric substrate 1. By filling apertures 26 with, for example, conductive paste 27a or bonding wire 27b, a resonant frequency of dielectric resonator 1 can be tuned.

Figure 12A:
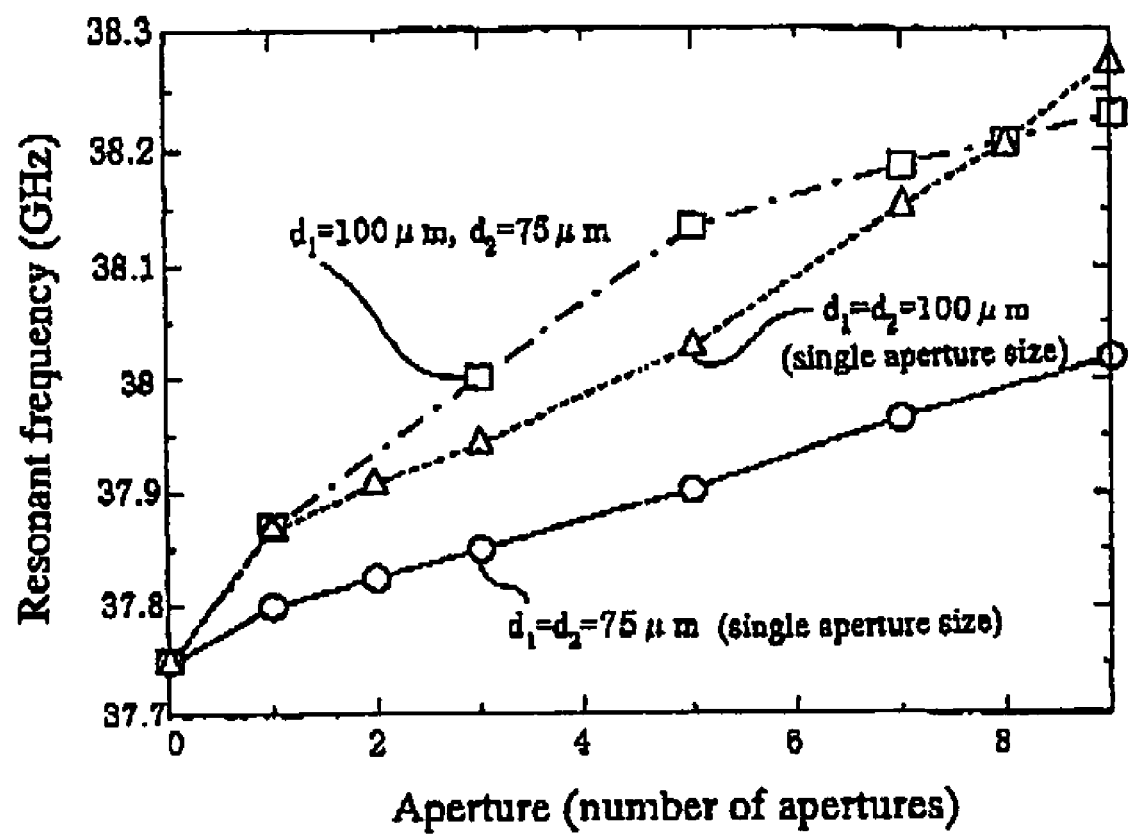
FIG. 12A is a figure showing calculation results of a resonant frequency change vs the number of apertures formed on a dielectric resonator according to the present invention.

FIG. 12A is a figure showing calculation results of resonant frequency change versus the number of apertures formed on a dielectric resonator according to the present invention. Calculation results of resonant frequency change when the number of apertures is varied are shown for a resonator at 38 GHz band. It can be seen that the resonant frequency can be tuned in step like by varying the number of apertures 26. If the apertures are arranged in a concentric fashion against a center of the resonator, the tuning becomes easy because a tuning rate for the resonant frequency per one aperture of the concentric apertures becomes almost equal. In addition, by varying a size of the aperture, the tuning rate of each aperture for the resonant frequency can be changed. If a plurality of sizes of the aperture is prepared, a fine tuning of the resonant frequency can be achieved by the different tuning rate of each aperture.

Figure 12B:
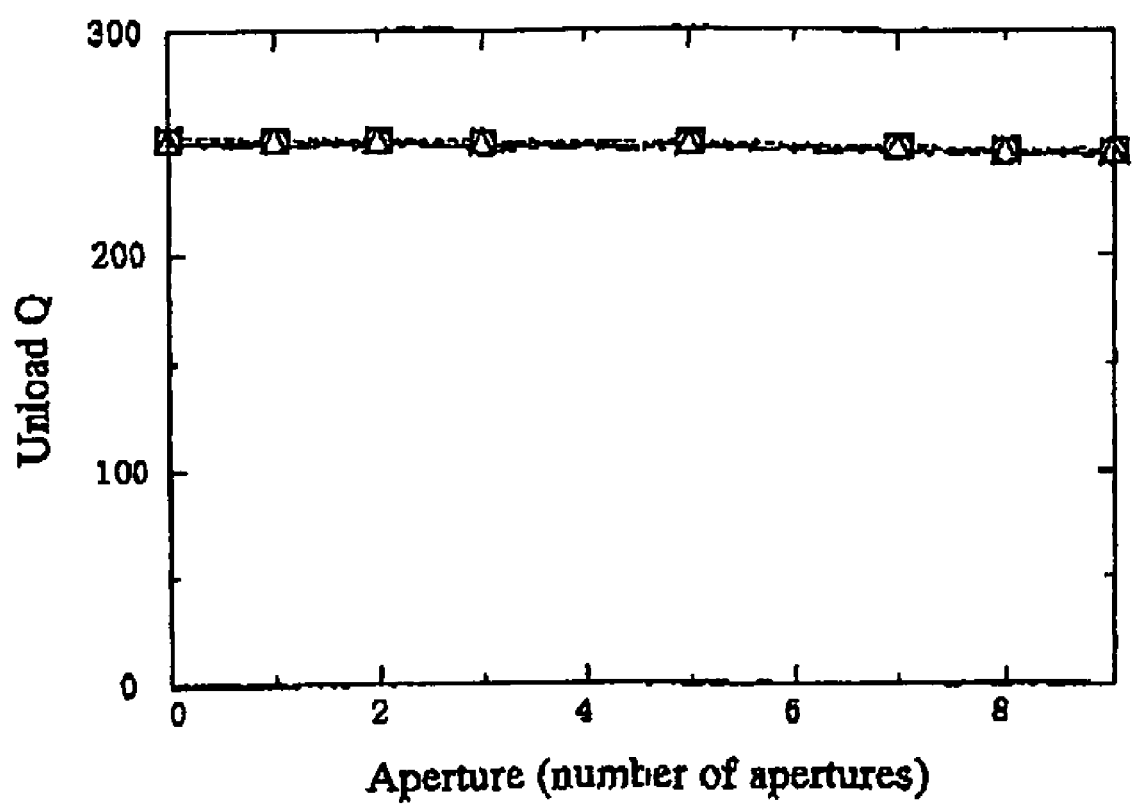
FIG. 12B is a figure showing calculation results of a change of unload Q vs the number of apertures formed on a dielectric resonator according to the present invention.

FIG. 12B is a figure showing calculation results of a change of unload Q versus the number of apertures formed on a dielectric resonator according to the present invention. The calculation results of unload Q for the case of FIG. 12A are shown in FIG. 12B, however, no degradation is seen in the figure. In this case, an example, in which apertures 26 are formed in advance and the apertures are filled one by one, has been shown. However, it may also be possible to tune the resonant frequency by sequentially forming aperture 26 one by one using, for example, a laser.

In the above, the preferred embodiments have been explained. However, the present invention is not limited to these embodiments and the each embodiment may be changed within a technological scope and sprit of the present invention. In the embodiments, an example using a field effect transistor as an active device has been shown. However, for example, a bipolar transistor is also usable. Also, for connecting ground conductive layers 3a and 3b, and 3c and 3d on both surfaces of the substrate, it is possible to use a structure in which a conductive layer is formed only on an inner surface of a via hole such as a plated through hole instead of plug conductors 4b, 4d.

According to the present invention, by bonding an oscillation circuit with flip chip bonding to a coupling element configured by forming a slot in a ground conductive layer on a dielectric resonator, controllability and reproducibility of the coupling rate of the oscillator using the dielectric resonator can be improved, and the circuitry can also be minimized. In addition, according to the embodiment disposing a plurality of apertures with different sizes in the ground conductive layer on the opposite side of the coupling element, a fine tuning of the frequency can be achieved by controlling the number of apertures.

In the present invention, a dielectric resonator is connected to an oscillation circuit as an example of a negative resistance generating circuit. However, if a circuit, as well as the oscillation circuit, generates a negative resistance, the effect of the present invention can be extracted by connecting a dielectric resonator according to the present invention to the circuit. A bump is exemplified as a bonding means between the negative resistance generating circuit and the dielectric resonator, but not limited to the bump. Any conductive contact is available even though a wiring which has a long distance is not desirable.

POSSIBILITY FOR INDUSTRIAL APPLICATION

The present invention is applicable to anything if it is related to a dielectric resonator used for a micro wave band and a millimeter wave band, to a frequency tuning method of the band, and to an integrated circuit using the dielectric resonator. The application possibility is not limited in its extension.

While the present invention has been described by associating with some preferred embodiments and examples, it is to be understood that these embodiments and examples are merely for illustrative of the invention by an example, and not restrictive. While it will be obvious to those skilled in the art that various changes and substitutions by equivalent components and techniques are cased upon reading the specification, it is believed obvious that such changes and substitutions fit into the true scope and spirit of the present invention.

What is claimed is:

1. A dielectric resonator which has an effective resonant area extending in three dimensions and confining electromagnetic waves, wherein the dielectric resonator comprises at least one coupling element, and the at least one coupling element comprises:

at least one slot formed on at least one conductive surface extending in two dimensions on at least a part of peripheral surface of the effective resonant area; and at least one patch conductive area adjacent to the at least one slot, wherein an inside of the effective resonant area comprises a dielectric substance, a periphery of the effective resonant area comprises a first conductive layer extending on a first surface of a dielectric substrate, a second conductive layer extending on a second surface of the dielectric substrate, and a plurality of conductive structures, a space between adjacent conductive structures is not greater than ½ of a wave length of the electromagnetic waves at a resonant frequency, the at least one conductive surface comprises the first conductive layer, at least one apertural part is formed on an area of the second conductive layer corresponding to an area of the first conductive layer where the at least one coupling element exists;

the at least one apertural part comprises a plurality of apertural parts with different sizes; and the plurality of apertural parts is arranged in a concentric fashion.

2. A dielectric resonator according to claim 1, wherein the at least one apertural part is filled with a conductive material.

3. An integrated circuit, comprising:

a dielectric resonator which has an effective resonant area extending in three dimensions and confining electromagnetic waves, wherein the dielectric resonator comprises at least one coupling element, the at least one coupling element comprises at least one slot formed on at least one conductive surface extending in two dimensions on at least a part of peripheral surface of the effective resonant area, and at least one patch conductive area adjacent to the at least one slot;

the integrated circuit further comprises at least one negative resistance generating circuit connected to the at least one coupling element through at least one conductive contact; and the at least one negative resistance generating circuit is arranged above the effective resonant area of the dielectric resonator.

4. An integrated circuit according to claim 3, wherein the conductive contact comprises a conductive bump.

5. An integrated circuit according to claim 3, wherein the at least one negative resistance generating circuit is formed on a first circuit substrate, and includes a first transmission line directly contacting to the at least one conductive contact.

6. An integrated circuit according to claim 5, wherein the at least one conductive contact comprises a first conductive contact and a second conductive contact,
the at least one negative resistance generating circuit further includes a varactor diode formed on the first circuit substrate, and
the at least one coupling element comprises a first coupling element connected to the first transmission line through the first conductive contact and a second coupling element connected to the varactor diode through the second conductive contact.

7. An integrated circuit according to claim 5, wherein the at least one negative resistance generating circuit includes at least one active device, the at least one conductive contact is connected to a center part of the first transmission line, and a first edge of the first transmission line is connected to the active device and a second edge of the first transmission line is connected to a termination resistor.

8. An integrated circuit according to claim 5, wherein the at least one conductive contact comprises a first conductive contact and a second conductive contact,
the at least one negative resistance generating circuit includes at least one active device, and
the at least one coupling element is connected to a termination resistor through the second conductive contact and the first transmission line, as well as connected to the active device through the first conductive contact and the first transmission line.

9. An integrated circuit according to claim 5, wherein the at least one conductive contact comprises a first conductive contact,
the at least one negative resistance generating circuit includes at least one active device, and
the at least one coupling element comprises a first coupling element connected to an output side of the active device through the first conductive contact and a second transmission line formed on the first circuit substrate, and a second coupling element connected to a transmission line formed outside of the effective resonant area.

10. An integrated circuit according to claim 5, wherein a second transmission line formed outside of the effective resonant area and a third transmission line formed on the first circuit substrate are connected through a conductive bump.

11. An integrated circuit according to claim 5, wherein a second transmission line formed outside of the effective resonant area and a third transmission line formed on a second circuit substrate are connected through a conductive bump.

12. An integrated circuit according to claim 11, wherein a concave portion is formed on the second circuit substrate, and the first circuit substrate mounted on the dielectric resonator is put in the concave portion.

13. An integrated circuit according to claim 12, wherein the first circuit substrate is encapsulated in the concave portion of the second circuit substrate with a resin sealing a space between the second circuit substrate and the dielectric resonator.

14. An integrated circuit according to claim 3,
wherein an inside of the effective resonant area comprises a dielectric substance,
a periphery of the effective resonant area comprises a first conductive layer extending on a first surface of a dielectric substrate, a second conductive layer extending on a second surface of the dielectric substrate, and a plurality of conductive structures,
a space between adjacent conductive structures is not greater than ½ of a wave length of electromagnetic waves at a resonant frequency,
plurality of conductive structures are arranged in a substantially circular pattern,
and the plurality of conductive structures is a plurality of via plugs formed in a plurality of via holes passing through the dielectric substrate for connecting the first conductive layer and the second conductive layer.

15. A dielectric resonator, comprising:
a dielectric substrate;
a first conductive layer formed on a first surface of the dielectric substrate;
a second conductive layer formed on a second surface of the dielectric substrate;
a plurality of conductive via plugs filling a plurality of via holes arranged in a substantially circular pattern, wherein a space between adjacent via holes is not greater than ½ of a wave length of electromagnetic waves at a resonant frequency;
an effective resonant area extending in three dimensions and defined by the first and the second conductive layers and the plurality of via plugs;
at least one coupling element formed on the first conductive layer in the effective resonant area,
wherein the at least one coupling element includes at least one slot formed on the first conductive layer and at least one patch conductive area adjacent to the at least one slot;
at least one conductive surface comprises the first conductive layer, and at least one apertural part is formed on an area of the second conductive layer corresponding to an area of the first conductive layer where the at least one coupling element exists;
the at least one apertural part comprises a plurality of apertural parts with different sizes;
the plurality of apertural parts is arranged in a concentric fashion.

16. A dielectric resonator according to claim 15, wherein the at least one apertural part is filled with a conductive material.

17. A dielectric resonator, comprising:
a dielectric substrate;
a first conductive layer formed on a first surface of the dielectric substrate;
a second conductive layer formed on a second surface of the dielectric substrate;
a plurality of conductive via plugs filling a plurality of via holes arranged in a substantially circular pattern, wherein a space between adjacent via holes is not greater than ½ of a wave length of electromagnetic waves at a resonant frequency;
an effective resonant area extending in three dimensions and defined by the first and the second conductive layers and the plurality of via plugs; and
at least one coupling element formed on the first conductive layer in the effective resonant area,
wherein the at least one coupling element includes at least one slot formed on the first conductive layer and at least one patch conductive area adjacent to the at least one slot; and
the at least one coupling element comprises a plurality of coupling elements which includes two types of coupling element, the one is a first coupling element in which the slot at least partially surrounds the patch conductive area, the other is a second coupling element in which the slot entirely surrounds the patch conductive area.

18. A dielectric resonator, comprising:

a dielectric substrate;

a first conductive layer formed on a first surface of the dielectric substrate;

a second conductive layer formed on a second surface of the dielectric substrate;

a plurality of conductive via plugs filling a plurality of via holes arranged in a substantially circular pattern, wherein a space between adjacent via holes is not greater than ½ of a wave length of electromagnetic waves at a resonant frequency;

an effective resonant area extending in three dimensions and defined by the first and the second conductive layers and the plurality of via plugs;

at least one coplanar line formed outside of the effective resonant area; and at least one coupling element formed on the first conductive layer in the effective resonant area, wherein the at least one coupling element includes at least one slot formed on the first conductive layer and at least one patch conductive area adjacent to the at least one slot; and the at least one coplanar line formed outside of the effective resonant area is not connected to the at least one coupling element formed on the first conductive layer in the effective resonant area.

19. A dielectric resonator, comprising:

a dielectric substrate;

a first conductive layer formed on a first surface of the dielectric substrate;

a second conductive layer formed on a second surface of the dielectric substrate;

a plurality of conductive via plugs filling a plurality of via holes arranged in a substantially circular pattern, wherein a space between adjacent via holes is not greater than ½ of a wave length of electromagnetic waves at a resonant frequency;

an effective resonant area extending in three dimensions and defined by the first and the second conductive layers and the plurality of via plugs;

at least one coupling element formed on the first conductive layer in the effective resonant area;

at least one signal conductive layer formed in an area where the at least one coupling element exists so as to be adjacent to the at least one slot, and the at least one signal conductive layer configures at least one coplanar line and connects with at least one patch conductive area;

wherein said at least one coplanar line comprises;

a first coplanar line formed entirely within the effective resonant area; and a second coplanar line formed entirely within the effective resonant area;

wherein the at least one coupling element includes the at least one slot formed on the first conductive layer and the at least one patch conductive area adjacent to the at least one slot; and wherein the first coplanar line and the second coplanar line are connected to the patch conductive area.

* * * * *